United States Patent
Zhang et al.

(10) Patent No.: US 11,114,842 B1
(45) Date of Patent: Sep. 7, 2021

(54) DUAL PWM RELAY DRIVER WITH DIAGNOSTICS FOR FUNCTIONAL SAFETY SYSTEM

(71) Applicant: Rockwell Automation Technologies, Inc., Mayfield Heights, OH (US)

(72) Inventors: Yanbin Zhang, Shanghai (CN); Yutao Wang, Brookfield, WI (US); David M. Messersmith, Kenosha, WI (US); David B. Berman, Franklin, WI (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 0 days.

(21) Appl. No.: 16/884,318

(22) Filed: May 27, 2020

(51) Int. Cl.
| | | |
|---|---|---|
| *H02H 7/00* | (2006.01) | |
| *H02H 7/22* | (2006.01) | |
| *H03K 5/24* | (2006.01) | |
| *H02H 1/00* | (2006.01) | |

(52) U.S. Cl.
CPC .......... *H02H 7/222* (2013.01); *H02H 1/0007* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 7,113,385 B2 * | 9/2006 | Babich | H01F 3/02 |
| | | | 361/154 |
| 9,407,191 B2 * | 8/2016 | Chen | H02P 7/04 |
| 10,250,031 B2 * | 4/2019 | Choi | H01F 7/1844 |
| 10,520,050 B2 * | 12/2019 | Pearce | H02P 29/04 |

FOREIGN PATENT DOCUMENTS

| | | |
|---|---|---|
| CN | 201928233 U | 8/2011 |
| CN | 102624223 A | 8/2012 |
| CN | 102723733 A | 10/2012 |
| CN | 202696531 U | 1/2013 |
| CN | 106793222 A | 5/2017 |
| CN | 108255156 A | 7/2018 |
| JP | 2014197944 A | 10/2014 |
| TW | 201316369 A | 4/2013 |
| WO | 2017140783 A1 | 8/2017 |

* cited by examiner

*Primary Examiner* — Stephen W Jackson
(74) *Attorney, Agent, or Firm* — Kunzler Bean & Adamson; Bruce R. Needham

(57) ABSTRACT

A component includes first and second switches in series and connected between a power source and a coil of contacts of a safety relay. A first controller controls the first switch with a close signal that closes the first switch or a first PWM signal that opens and closes the first switch on each PWM cycle. A second controller controls the second switch with a close signal that closes the second switch or a second PWM signal that opens and closes the second switch on each PWM cycle. A PWM sensing circuit connected to the coil sends a sensed PWM signal to an input of the first and second controllers. The first controller sends the first PWM signal while the second controller sends a close signal and vice-versa. The controllers verify that the received PWM signal matches the sent PWM signal.

20 Claims, 9 Drawing Sheets

DUAL PWM RELAY DRIVER WITH DIAGNOSTICS FOR FUNCTIONAL SAFETY SYSTEM

BACKGROUND INFORMATION

The subject matter disclosed herein relates to safety relays and more particularly relates to fault tolerant safety relays that reduce power consumption.

BRIEF DESCRIPTION

A component for a dual pulse-width modulation ("PWM") relay driver with diagnostics is disclosed. An alternate component and a system also perform the functions of the component. The component includes a first switch connected to a power source of a safety relay and a second switch connected between the first switch and a first connection of a coil of normally open contacts of the safety relay. The component includes a first controller connected to control the first switch with a first output signal that is a close signal that closes the first switch or a first PWM signal with a first duty cycle that opens and closes the first switch on each PWM cycle. The component includes a second controller connected to control the second switch with a second output signal that includes a close signal that closes the second switch or a second PWM signal with a second duty cycle that opens and closes the second switch on each PWM cycle. The first duty cycle is different from the second duty cycle. The component includes a PWM sensing circuit connected to a second connection of the coil that sends a sensed PWM signal to an input of the first controller and an input of the second controller. The first controller sends the first PWM signal while the second controller sends a close signal and the second controller sends the second PWM signal while the first switch sends a close signal. The first controller verifies that the received PWM signal matches the first PWM signal while sending the first PWM signal and the second controller verifies that the received PWM signal matches the second PWM signal while sending the second PWM signal.

A system with a dual PWM relay driver with diagnostics includes an electrical component and a safety relay controlling power to the electrical component. The safety relay includes a first switch connected to a power source of a safety relay and a second switch connected between the first switch and a first connection of a coil of normally open contacts of the safety relay. The safety relay includes a first controller connected to control the first switch with a first output signal that is a close signal that closes the first switch or a first PWM signal with a first duty cycle that opens and closes the first switch on each PWM cycle. The safety relay includes a second controller connected to control the second switch with a second output signal that is a close signal that closes the second switch or a second PWM signal with a second duty cycle that opens and closes the second switch on each PWM cycle, the first duty cycle is different from the second duty cycle. The safety relay includes a PWM sensing circuit connected to a second connection of the coil that sends a sensed PWM signal to an input of the first controller and an input of the second controller. The first controller sends the first PWM signal while the second controller sends a close signal and the second controller sends the second PWM signal while the first switch sends a close signal. The first controller verifies that the received PWM signal matches the first PWM signal while sending the first PWM signal and the second controller verifies that the received PWM signal matches the second PWM signal while sending the second PWM signal.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
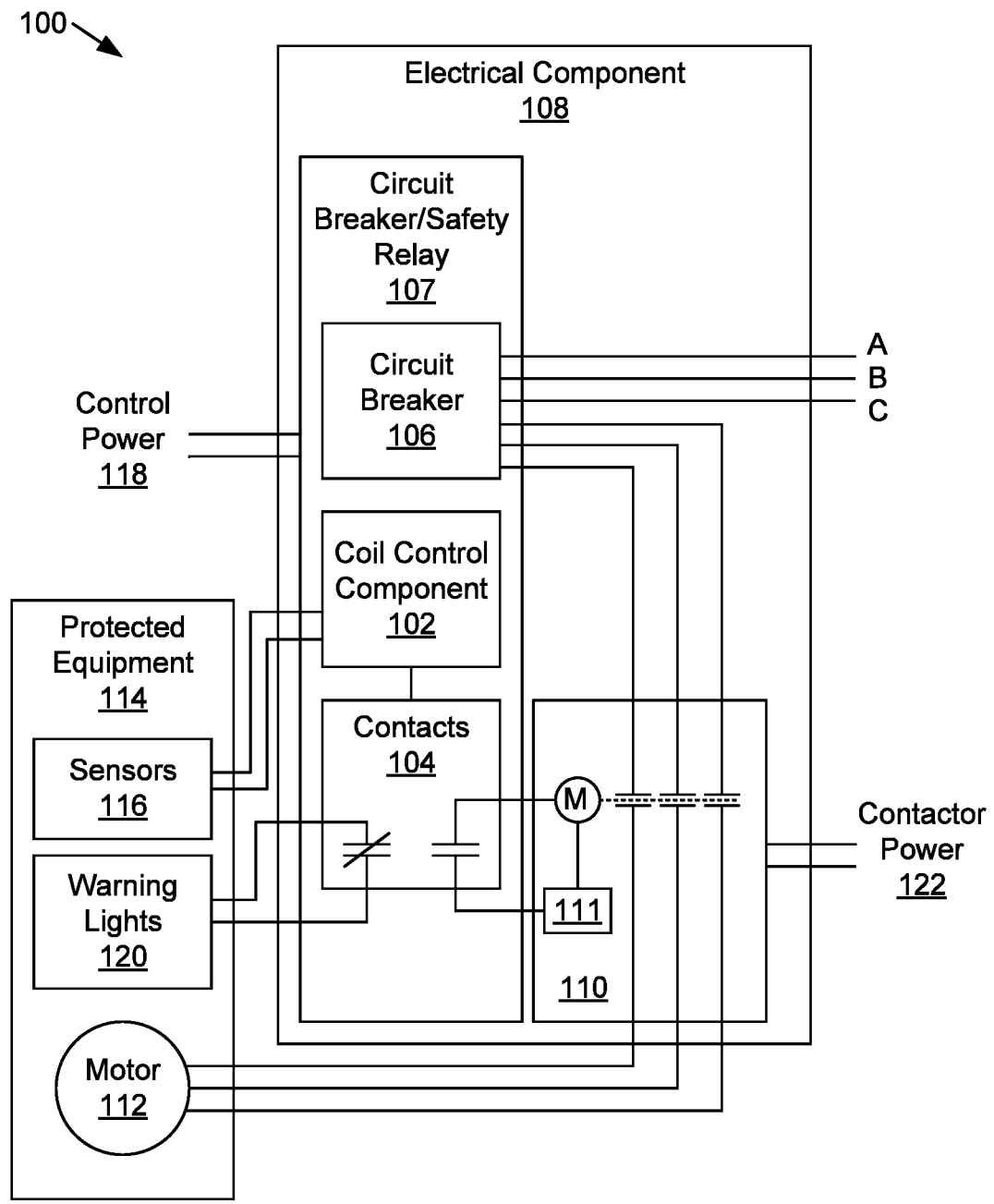
FIG. 1 is a schematic block diagram of system with a dual PWM relay driver with diagnostics according to an embodiment.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. The term "and/or" indicates embodiments of one or more of the listed elements, with "A and/or B" indicating embodiments of element A alone, element B alone, or elements A and B taken together.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or partly as a computer program product. Accordingly, aspects of the present invention may take the form of an entirely hardware embodiment or an embodiment combining hardware and software aspects (including firmware, resident software, micro-code, etc.) that may all generally be referred to herein as a "circuit," "module," "component" or "system." Furthermore, aspects of the present invention may take the form of a computer program product embodied in one or more computer readable medium(s) having program code embodied thereon.

Some of the functional units described in this specification may be labeled as modules, circuits, components, etc., in order to more particularly emphasize their implementation independence. For example, a module, circuit or controller may be implemented as a hardware circuit comprising custom VLSI circuits or gate arrays, off-the-shelf semiconductors such as logic chips, transistors, or other discrete components. A module, component or circuit may also be implemented in programmable hardware devices such as field programmable gate arrays ("FPGAs"), programmable array logic, programmable logic devices or the like.

Modules, components or circuits may also be partially implemented in software for execution by various types of processors. An identified module, component or circuit of program code may, for instance, comprise one or more physical or logical blocks of computer instructions which may, for instance, be organized as an object, procedure, or function. Nevertheless, the executables of an identified module, component or circuit need not be physically located together, but may comprise disparate instructions stored in different locations which, when joined logically together, comprise the module and achieve the stated purpose for the module.

Program code may be a single instruction, or many instructions, and may even be distributed over several different code segments, among different programs, and across several memory devices. Similarly, operational data may be identified and illustrated herein within modules, components, or circuits, and may be embodied in any suitable form and organized within any suitable type of data structure. The operational data may be collected as a single data set, or may be distributed over different locations including over different storage devices, and may exist, at least partially, merely as electronic signals on a system or network. Where all or a part of a module, component or circuit are implemented in software, the program code may be stored and/or propagated on in one or more computer readable medium(s).

The computer readable medium may be a tangible computer readable storage medium storing the program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable storage medium may include but are not limited to a hard disk, a random access memory ("RAM"), a read-only memory ("ROM"), an erasable programmable read-only memory ("EPROM" or flash memory), a magnetic storage device, a micromechanical storage device, or any suitable combination of the foregoing. In the context of this document, a computer readable storage medium may be any tangible medium that can contain, and/or store program code for use by and/or in connection with an instruction execution system, apparatus, or device and, as used herein, a computer readable storage medium is not to be construed as a transitory signal.

The computer readable medium may also be a computer readable signal medium. A computer readable signal medium may include a propagated data signal with program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport program code for use by or in connection with an instruction execution system, apparatus, or device. Program code embodied on a computer readable signal medium may be transmitted using any appropriate medium, including but not limited to wire-line, optical fiber, Radio Frequency ("RF"), or the like, or any suitable combination of the foregoing.

In one embodiment, the computer readable medium may comprise a combination of one or more computer readable storage mediums and one or more computer readable signal mediums. For example, program code may be both propagated as an electro-magnetic signal through a fiber optic cable for execution by a processor and stored on RAM storage device for execution by the processor.

Furthermore, the described features, structures, or characteristics of the embodiments may be combined in any suitable manner. In the following description, numerous specific details are provided, such as examples of programming, software modules, user selections, hardware modules, hardware components, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

The program code may be stored in a computer readable medium that can direct a computer, microcontroller, other programmable data processing apparatus, or other devices to function in a particular manner, such that the instructions stored in the computer readable medium produce an article of manufacture including instructions which implement the function/act specified in schematic flowchart diagrams and/or schematic block diagrams block or blocks.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by program code, circuits, components, etc. The program code may be provided to a processor of a controller, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The program code may also be loaded onto a controller, other programmable data processing apparatus, or other devices to cause a series of operational steps to be performed on the controller, other programmable apparatus or other devices to produce a computer implemented process such that the program code which executed on the controller or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, component, circuit, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

The description of elements in each figure may refer to elements of proceeding figures. Like numbers refer to like elements in all figures, including alternate embodiments of like elements.

A component for a dual pulse-width modulation ("PWM") relay driver with diagnostics is disclosed. An alternate component and a system also perform the functions of the component. The component includes a first switch connected to a power source of a safety relay and a second switch connected between the first switch and a first connection of a coil of normally open contacts of the safety relay. The component includes a first controller connected to control the first switch with a first output signal that is a close signal that closes the first switch or a first PWM signal with a first duty cycle that opens and closes the first switch on each PWM cycle. The component includes a second controller connected to control the second switch with a second output signal that includes a close signal that closes the second switch or a second PWM signal with a second duty cycle that opens and closes the second switch on each PWM cycle. The first duty cycle is different from the second duty cycle. The component includes a PWM sensing circuit connected to a second connection of the coil that sends a sensed PWM signal to an input of the first controller and an input of the second controller. The first controller sends the first PWM signal while the second controller sends a close signal and the second controller sends the second PWM signal while the first switch sends a close signal. The first controller verifies that the received PWM signal matches the first PWM signal while sending the first PWM signal and the second controller verifies that the received PWM signal matches the second PWM signal while sending the second PWM signal.

In some embodiments, the component includes a current sensor connected between the second connection of the coil and a ground of the safety relay, an analog test switch connected between the second connection of the coil and the inputs of the first controller and the second controller, and a PWM test switch connected between the PWM sensing circuit and the inputs of the first controller and the second controller. The PWM test switch and the analog test switch alternately close and the first and second controllers verify proper PWM operation while the PWM test switch is closed and verify proper current from the coil while the analog switch is closed. In other embodiments, the current sensor is a resistor. In other embodiments, the first controller opens the first switch and/or the second controller opens the second switch in response to detecting an abnormal current condition while the analog test switch is closed. In other embodiments, while the analog test switch is closed, the first and second controllers determine a current at the second connection of the coil to determine one or more of a coil failure, a first switch failure, and a second switch failure due to current not within an expected range during a particular operation of the first and second switches.

In some embodiments, the component includes a PWM alternating circuit that periodically switches between the first controller sending the first PWM signal while the second controller sends a close signal and the second controller sending the second PWM signal while the first controller sends a close signal. In other embodiments, the component includes a breaker close circuit that commands the first controller and the second controller to both send a close signal to close the first switch and the second switch for a startup period prior to operation where one of the first and the second controllers sends a PWM signal and the other of the first and the second controllers sends a close signal. In other embodiments, the PWM sensing circuit includes a comparator that inverts a PWM signal received from the second connection of the coil. The comparator sends the inverted PWM signal to the inputs of the first and second controllers and the first and second controllers determine if the received PWM matches the first or second PWM signals based on the inverted PWM signal.

In some embodiments, the first PWM signal and the second PWM signal reduce power consumption of the coil and each have a frequency and duty cycle adequate to prevent unwanted coil drop out that opens the contacts. In other embodiments, the first and second PWM switches are semiconductor switches and a switching frequency of the first PWM signal and the second PWM signal are selected to open and close the first switch during each switching cycle based on the first PWM signal and to open and close the second switch during each switching cycle based on the second PWM signal.

In some embodiments, the component includes a diode connected in parallel with the coil, where a cathode of the diode is connected to the first connection of the coil and an anode of the diode is connected to the second connection of the coil. In other embodiments, the first controller opens the first switch in response to determining that the received PWM signal does not match the first PWM signal while the first controller is sending the first PWM signal and the second controller opens the second switch in response to determining that the received PWM signal does not match the second PWM signal while the second controller is sending the second PWM signal.

An alternate component with a dual PWM relay driver with diagnostics includes a first switch connected to a power source of a safety relay, where the first switch is a semiconductor switch, and a second switch connected between the first switch and a first connection of a coil of normally open contacts of the safety relay, where the second switch is a semiconductor switch. The component includes a first microcontroller connected to control the first switch, where a first output signal of the first microcontroller is a close signal that closes the first switch or a first PWM signal with a first duty cycle that opens and closes the first switch on each PWM cycle. The component includes a second microcontroller connected to control the second switch, where a second output signal of the second microcontroller is a close signal that closes the second switch or a second PWM signal with a second duty cycle that opens and closes the second switch on each PWM cycle. The first duty cycle is different from the second duty cycle.

The component includes a comparator with an input connected to a second connection of the coil and an output connected to an input of the first microcontroller and an input of the second microcontroller. The comparator inverts the received PWM signal from the second connection of the coil. The first microcontroller sends the first PWM signal while the second microcontroller sends a close signal and the second microcontroller sends the second PWM signal while the first switch sends a close signal. The first microcontroller inverts the PWM signal from the comparator and verifies that a duty cycle of a resulting PWM signal matches a duty cycle of the first PWM signal while sending the first PWM signal and the second microcontroller inverts the PWM signal from the comparator and verifies that a duty cycle of a resulting PWM signal matches a duty cycle of the second PWM signal while sending the second PWM signal. The first microcontroller opens the first switch in response to determining that the duty cycle of the resulting PWM signal does not match the first duty cycle while the first microcontroller is sending the first PWM signal and the second microcontroller opens the second switch in response to determining that the duty cycle of the resulting PWM signal does not match the second duty cycle while the second microcontroller is sending the second PWM signal.

In some embodiments, the component includes a resistor connected between the second connection of the coil and a ground of the safety relay, an analog test switch connected between the second connection of the coil and the inputs of the first microcontroller and the second microcontroller. In the embodiment, the component includes a PWM test switch connected between the output of the comparator and the inputs of the first microcontroller and the second microcontroller. The PWM test switch and the analog test switch alternately close, where the first and second microcontrollers verify proper PWM operation while the PWM test switch is closed and verify proper current from the coil while the analog switch is closed. The first microcontroller opens the first switch and/or the second microcontroller opens the second switch in response to detecting an abnormal current condition while the analog test switch is closed.

In other embodiments, while the analog test switch is closed, the first and second microcontrollers determine a current at the second connection of the coil to determine one or more of a coil failure, a diode failure, a resistor failure, a first switch failure, and a second switch failure due to current not within an expected range during a particular operation of the first and second switches. In other embodiments, the component includes a PWM alternating circuit that periodically switches between the first microcontroller sending the first PWM signal while the second microcontroller sends a close signal and the second microcontroller sending the second PWM signal while the first microcontroller sends a close signal.

In some embodiments, the component includes a breaker close circuit that commands the first microcontroller and the second microcontroller to both send a close signal to close the first switch and the second switch for a startup period prior to operation where one of the first and the second microcontrollers sends a PWM signal and the other of the first and the second microcontrollers sends a close signal. In other embodiments, the first PWM signal and the second PWM signal reduce power consumption of the coil and each have a frequency and duty cycle adequate to prevent unwanted coil drop out to open the contacts.

A system with a dual PWM relay driver with diagnostics includes an electrical component and a safety relay controls power to the electrical component. The safety relay includes a first switch connected to a power source of a safety relay and a second switch connected between the first switch and a first connection of a coil of normally open contacts of the safety relay. The safety relay includes a first controller connected to control the first switch with a first output signal that is a close signal that closes the first switch or a first PWM signal with a first duty cycle that opens and closes the first switch on each PWM cycle. The safety relay includes a second controller connected to control the second switch with a second output signal that is a close signal that closes the second switch or a second PWM signal with a second duty cycle that opens and closes the second switch on each PWM cycle, the first duty cycle is different from the second duty cycle. The safety relay includes a PWM sensing circuit connected to a second connection of the coil that sends a sensed PWM signal to an input of the first controller and an input of the second controller. The first controller sends the first PWM signal while the second controller sends a close signal and the second controller sends the second PWM signal while the first switch sends a close signal. The first controller verifies that the received PWM signal matches the first PWM signal while sending the first PWM signal and the second controller verifies that the received PWM signal matches the second PWM signal while sending the second PWM signal.

In some embodiments, the system includes a current sensor connected between the second connection of the coil and a ground of the safety relay, an analog test switch connected between the second connection of the coil and the inputs of the first controller and the second controller, and a PWM test switch connected between the PWM sensing circuit and the inputs of the first controller and the second controller. The PWM test switch and the analog test switch alternately close and the first and second controllers verify proper PWM operation while the PWM test switch is closed and verify proper current from the coil while the analog switch is closed.

FIG. 1 is a schematic block diagram of system 100 with a dual PWM relay driver with diagnostics according to an embodiment. The system 100 includes a coil control component 102 connected to contacts 104, and a circuit breaker 106 in a circuit breaker/safety relay 107 of an electrical component 108, a motor controller/contactor 110, starter logic 111, a motor 112, protected equipment 114, sensors 116, control power 118, warning lights 120 and contactor power 122, which are explained in more detail below.

For safe operation, often protected equipment 114 and areas around the protected equipment 114 include various sensors 116, such as motion sensors, interlocks, light curtains, emergency stop switches, etc. which are used to stop a motor 112, a valve, a pneumatic press, or other protected equipment 114 for safety of operators. Typically, a safety relay is used to open contacts 104, which stop motors 112 and other protected equipment 114 to prevent injury to equipment operators. For example, protected equipment 114 such as a printing press, assembly line, etc. may include various light curtains, motion sensors, etc. that stop motors 112, valves, etc. and when a barrier is crossed, an interlock is not actuated, or the like. When the various types of sensors 116 are actuated, when an interlock switch is not closed, etc., sensor wiring connected to a coil control component 102 transmit one or more signals to the coil control component 102, which causes normally contacts 104 to open, which then causes the protected equipment 114 to stop.

Traditionally, safety relays are separate from circuit breakers 106, motor controllers 110, motor contactors 110, thermal overload relays, etc. and may be grouped with control and safety equipment in an enclosure that may include one or more of circuit breakers 106, fuses, motor overload relays, and the like.

In the embodiment depicted in FIG. 1, a safety relay, which includes the coil control component 102 and contacts 104 is packaged with a circuit breaker 106 in a combination circuit breaker/safety relay 107. In some embodiments, the circuit breaker/safety relay 107 is in a size D-frame, but may be included in other frame sizes. One particular problem with grouping a circuit breaker 106 with a safety relay in a combination circuit breaker/safety relay 107 is the heat that is generated by the circuit breaker 106 and safety relay components. For example, power to a coil controlling opening and closing of the contacts 104 may generate heat, which may be difficult to handle.

Other aspects of safety relays are redundancy and diagnostics. Depending on a level of required safety, some safety relays include a high degree of redundancy to increase fault tolerance. For example, a particular sensor 116 may include dual sensor wiring so that if either set of sensor wiring detects a condition of the sensor 116 where the contacts 104 should open, the coil control component 102 causes the contacts 104 to open. Redundancy, such as one out of two designs, within the coil control component 102 also provide a degree of fault tolerance and safety. Diagnostics help to ensure that the components of the coil control component 102 have not failed. Many current designs include only periodic testing, which is not as desirable as dynamic testing that occurs continuously during normal operation. The coil control component 102 beneficially reduces power within the circuit breaker/safety relay 107 and other safety relays while providing one-out-of-two redundancy and fault tolerance with dynamic testing, as will be explained in further detail with regard to the embodiments of FIGS. 2-6.

Typical circuit breakers 106 include contacts, which open and close mechanically and open under various overcurrent conditions. Typically, the circuit breaker 106 senses current flowing through the circuit breaker 106 trip logic that opens the contacts. For example, the trip logic may include an inverse time characteristic that opens slowly for low current just over a circuit breaker rating and quickly for high current. In some circuit breakers 106, the inverse time characteristic allows for inrush current of a motor 112 and may include motor overload protection. Other circuit breakers 106 include adjustments to various parts of an inverse time characteristic to allow for circuit breaker coordination with upstream and downstream circuit breakers and components.

While the embodiment of FIG. 1 includes a circuit breaker/safety relay 107 that includes a circuit breaker 106 and safety relay components of a coil control component 102 and contacts 104, the coil control component 102 and contacts 104 described herein may also be used for other safety relays to protect various protected equipment 114. For example, the coil control component 102 and contacts 104 may be separated from the circuit breaker 106 or may be used in other applications with a fused disconnect, a motor controller within a motor control center ("MCC"), in an enclosure with other safety relays, etc. The coil control component 102 and contacts 104 of a safety relay may be used to stop and start other equipment than a motor 112. One of skill in the art will recognize other ways to use the coil control component 102 and contacts 104 in a safety relay along with fuses, circuit breakers, contactors, thermal overload relays, etc. in various configurations and in various enclosures.

The coil control component 102, as used herein, includes a typical coil for the contacts 104, which is energized by a circuit that includes a power source, two switches in series, and a ground where when the switch is closed, current flows from the power source, through the closed switches, through the coil to ground in a sufficient amplitude to prevent unintentional dropout of the coil where the contacts 104 open inadvertently. Currently, various safety relays include a single switch which is placed between the coil and ground, which presents some disadvantages.

In many current safety relays, diagnostics are included to check for component failure in an open or short circuit condition. Some current diagnostic circuitry requires periodically entering a test mode to determine if a component has failed or there is some malfunction that would prevent proper operation of contacts. During periods between testing, these safety relays are vulnerable to undetected failures. Other safety relays use various configurations of switches, current sensing, diagnostic components, etc. for testing. Some safety relays currently may have certain circuit failures that cause the circuit breaker to not open properly or cause immediate opening for a single failure.

The embodiments of the coil control component 102 described herein improve on current safety relay technology by increasing fault tolerance and safety while reducing power consumption of the safety relay and/or circuit breaker/safety relay 107. In addition, the coil control component 102 includes continuous diagnostic testing, which improves reliability and safety. The coil control component 102 is described in more detail with regard to FIGS. 2-6 below.

The circuit breaker/safety relay 107, in some embodiments, is a stand-alone circuit breaker/safety relay 107 that includes input and output terminals and may be mounted in an electrical component 108. In other embodiments, the circuit breaker/safety relay 107 may be integrated within the electrical component 108 or other electrical device, such as the motor control center, variable frequency drive, etc. In other embodiments, the circuit breaker/safety relay 107 is mounted external to the electrical component 108, but provides power to the electrical component 108. In other embodiments, the circuit breaker/safety relay 107 is mounted in a panel, a motor control center, or other electrical distribution equipment. One of skill in the art will recognize other embodiments of the circuit breaker/safety relay 107 that includes contacts 104 and a coil control component 102.

The electrical component 108 includes in the embodiment depicted in FIG. 1 a motor controller/contactor 110. In other embodiments, the electrical component 108 includes other loads and may or may not include a motor controller/contactor 110. In other embodiments, the electrical component 108 is the motor controller/contactor 110 and the circuit breaker/safety relay 107 may be located internal or external to the motor controller/contactor 110. In another example, the coil control component 102 and contacts 104 may be part of an MCC that feeds the motor 112 where the MCC includes a contactor, but may also include a fuse, a motor overload, etc. The contacts 104 are connected to motor starter circuitry to cause the contactor controlling the motor 112 to open upon sensing a problem. The embodiments described herein may be implemented in variations that differ from an integrated circuit breaker/safety relay 107 that include contacts 104 and a coil control component 102 where overload and short circuit functions are included in other components, such as a fuse.

In the depicted embodiment, the system 100 includes a motor 112 controlled by a motor controller/contactor 110 by way of an example. In the embodiment, the motor controller/contactor 110 includes starter logic 111 and normally open contacts 104 in the circuit breaker/safety relay 107 are wired in series with the starter logic 111 so that the normally open contacts 104 must be closed for the starter logic 111 to energize the contactor in the motor controller/contactor 110. The circuit breaker/safety relay 107, in certain embodiments, is configured to handle inrush current from the motor 112. Other embodiments include other loads in place of or in addition to the motor 112 and/or motor controller/contactor 110 that are fed by the circuit breaker/safety relay 107. The circuit breaker/safety relay 107 may feed any type of electrical component 108, such as computer equipment, heating and cooling equipment, kitchen appliances, outlets, lighting, an electrical distribution panel, etc. and the circuit breaker/safety relay 107 may be incorporated into any type of electrical component 108 that includes or feeds an electrical load.

In the system 100 of FIG. 1, the circuit breaker/safety relay 107 is fed by separate control power 118. For example, the control power 118 may be 24 volts direct current ("VDC") or other voltage and may be used to power sensors 116 and other safety equipment. In other embodiments, the control power 118 is derived from incoming power to the circuit breaker 106 and may be converted to a DC voltage with a converter within or external to the electrical component 108. In some embodiments, the circuit breaker/safety relay 107, electrical component 108, etc. may include a converter that further converts the incoming control power 118 to one or more other voltages. In other embodiments, the control power 118 is 24 V alternating current ("AC") and may be derived from a transformer. One of skill in the art will recognize other ways to derive control power 118 for the coil control component 102, for the circuit breaker/safety relay 107, a safety relay, etc.

The system 100 includes warning lights 120, which may be used to indicate a problem was detected by the sensors 116. For example, the contacts 104 may include a one or more normally closed contacts, which are connected to the warning lights 120 so that when the normally open contacts of the contacts 104 are open, indicating a problem detected by a sensor 116 or other problem with wiring or within the coil control component 102, the normally closed contacts of the contacts 104 provide power to the warning lights 120. In other embodiments, the normally closed contacts are wired to other equipment, such as to signaling equipment that sends an alert. One of skill in the art will recognize other ways to use normally closed contacts within the contacts 104.

In some embodiments, the system 100 includes contactor power 122 that feeds a coil of the motor controller/contactor 110. For example, the contactor power 122 may be different from the control power 118. In some embodiments, the contactor power 122 is 24 VAC. In some embodiments, the circuit breaker/safety relay 107 or a safety relay with the coil control component 102 and contacts 104 may be within an MCC and the contactor power 122 comes from the MCC. In other embodiments, the contactor power 122 is derived within the electrical component 108. For example, the electrical component 108 may include a transformer connected to utility power, incoming power, etc. In other embodiments, the contactor power 122 is the same as the control power 118. One of skill in the art will recognize other ways to provide power to the coil of the motor controller/contactor 110.

Note that the circuit breaker 106, motor controller/contactor 110 and motor 112 are depicted in FIG. 1 as being fed by three-phase power (phases A, B and C). In other embodiments, the circuit breaker 106, motor controller/contactor 110 and motor 112 are fed by single-phase power that is either line-to-line with two poles in a contactor/circuit breaker or line-to-ground with a single pole in the contactor/circuit breaker.

In some embodiments, the motor controller/contactor 110 is a motor starter where a contactor closes to provide full voltage instantly to the motor 112. In other embodiments, the motor controller/contactor 110 is a reduced voltage motor starter. In other embodiments, the motor controller/contactor 110 is a variable frequency drive ("VFD"). One of skill in the art will recognize other types of motor starters that may be incorporated into the motor controller/contactor 110.

Figure 2:
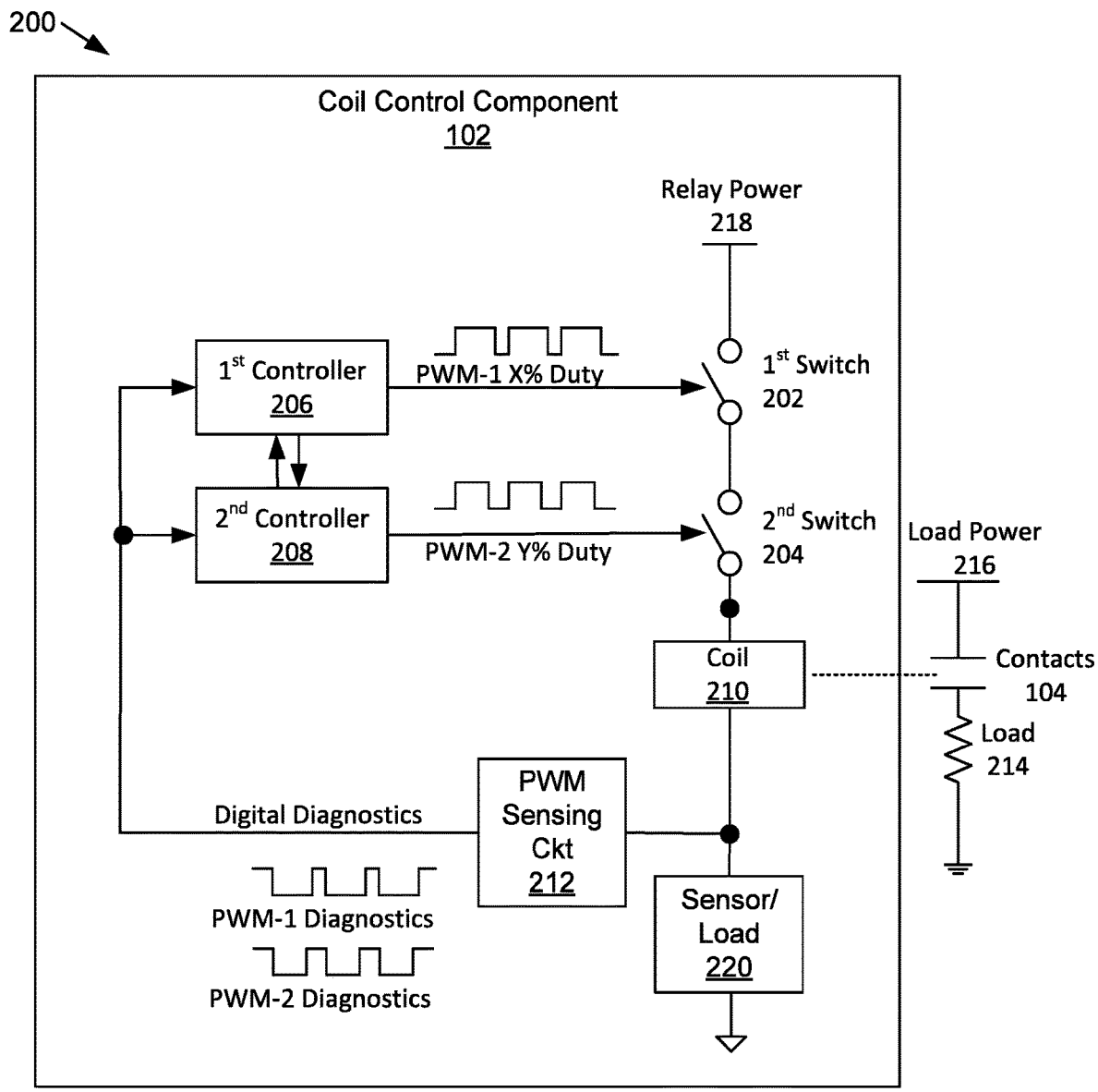
FIG. 2 is a schematic block diagram of a coil control component with a dual PWM relay driver with digital diagnostics according to an embodiment.

FIG. 2 is a schematic block diagram of an embodiment 200 of a coil control component 102 with a dual PWM relay driver with diagnostics. The embodiment 200 includes one embodiment of the coil control component 102 with a first switch 202, a second switch 204, a first controller 206, a second controller 208, a coil 210, a pulse-width modulation ("PWM") sensing circuit 212 and a load power source 216, contacts 104, a load 214, relay power 218 and sensor/load 220, which are described below.

The coil control component 102 and contacts 104 may be implemented in a safety relay, a circuit breaker/safety relay 107 or other safety equipment. The load 214 may be a motor 112 and/or associated contactor, starter, etc. or may be other protected equipment 114 and the load power 216 may be from a distribution panel, from an MCC, may be fed through a circuit breaker 106, a fuse, etc. Typically, the contacts 104 are auxiliary contacts that are part of starter logic 111 or are part of circuitry of other switches, interlocks, etc. and are used to stop protected equipment 114. Where the load 214 is a motor 112 as part of the protected equipment 114, the coil control component 102 and contacts 104 may be implemented as indicated in the system 100 of FIG. 1 or may be implemented as a safety relay 102 used in conjunction with separate overcurrent protection, starter logic 111, a motor controller/contactor 110, a variable frequency drive, etc. controlling the motor 112. Where the load 214 represents other protected equipment 114, the protected equipment 114 is protected by a safety relay with the coil control component 102 and contacts 104 or with the combination circuit breaker/safety relay 107 where main power to the protected equipment 114 runs through the circuit breaker and the contacts 104 are wired in series with other start/stop buttons, interlocks, etc. so that the sensors 116 control opening of the contacts 104, which then stop/disable the protected equipment 114.

The first switch 202 is connected to a power source, which is marked as relay power 218. The relay power 218, is derived from incoming power to the circuit breaker/safety relay 107 and may have a reduced magnitude with respect to a voltage of the incoming power. For example, the relay power 218 may be 24 VDC while incoming power to the circuit breaker 106 may be 120 V, 208 V, 277 V, 480 V, etc., depending on line-to-line or line-to-neutral connections and type of motor 112 or other load. The second switch 204 is connected to the first switch 202 in series and to a first connection of a coil 210 of normally open contacts 104. The circuit breaker/safety relay 107 or safety relay may also include another coil 210 and first and second switches 202, 204 connected to normally closed contacts. Note that the description of FIG. 1 included both normally open and normally closed contacts as part of the depicted contacts 104. In other embodiments described herein, the normally open contacts and normally closed contacts of the contacts 104 may be referred to as contacts 104. Typically, the contacts 104 includes at least normally open contacts so that any loss of power to the coil 210 results in opening of the contacts 104 for safety.

In some embodiments, the first switch 202 and the second switch 204 are semiconductor switches capable of opening and closing at a particular frequency. In other embodiments, the first switch 202 and the second switch 204 are mechanical switches capable of opening and closing at a frequency such that the coil 210 does not drop out unintentionally.

The first controller 206 is connected to control the first switch 202 with a first output signal that may be a close signal that closes the first switch 202 or a first PWM signal with a first duty cycle that opens and closes the first switch 202 on each PWM cycle. The first controller 206 also opens the first switch 202 to open the contacts 104 with an open signal that causes the first switch 202 to remain open.

The second controller 208 is connected to control the second switch 204 with a second output signal that may be a close signal that closes the second switch 204 or a second PWM signal with a second duty cycle that opens and closes the second switch 204 on each PWM cycle. The second controller 208 also opens the second switch 204 to open the contacts 104 with an open signal that causes the second switch 204 to remain open. The first duty cycle is different from the second duty cycle so that the first PWM signal is different than the second PWM signal, which is explained in more detail below.

In some embodiments, the first and second controller 206, 208 are microcontrollers and may include a processor and program code or may be implemented in a different way. The first and second controllers 206, 208, in other embodiments, are hardware controllers. For example, the first and second controllers 206, 208 may be application specific integrated circuits ("ASICs"), may be programmable hardware devices, such as FPGAs, programmable array logic, etc. For safety, the first controller 206 is physically a separate device than the second controller 208. Typically, the first and second controllers 206, 208 communicate so that if the first controller 206 sends an open signal to the first switch 202, the second controller 208 also opens the second switch 204, and vice-versa.

In some embodiments, the first and second controllers 206, 208 receive input from a user to change parameters, such as changing pulse-width modulation ("PWM") duty cycle, a time delay, etc. Typically, the first and second controllers 206, 208 are separate from overcurrent protection circuitry, but may receive a command from some over current or thermal protection circuitry to open the first and second switches 202, 204. One of skill in the art will recognize other ways to implement the first and second controllers 206, 208.

The PWM sensing circuit 212 is connected to a second connection of the coil 210 that sends a sensed PWM signal to an input of the first controller 206 and an input of the second controller 208. A sensor/load 220 is also connected to the second connection of the coil 210 and is explained in more detail below with regard to the embodiments, 300-500 of FIGS. 3-5. In one embodiment, the PWM sensing circuit 212 includes an inverter, comparator or other circuit that inverts the sensed PWM signal from the second connection of the coil 210 before sending this inverted PWM signal to the first and second controllers 206, 208. In other embodiments, the PWM sensing circuit 212 sends the sensed PWM circuit directly to the first and second controllers 206, 208.

In the embodiment 200, the first controller sends the first PWM signal while the second controller sends a close signal and the second controller sends the second PWM signal while the first switch sends a close signal. The first controller 206 verifies that the received PWM signal matches the first PWM signal while sending the first PWM signal and the second controller 208 verifies that the received PWM signal matches the second PWM signal while sending the second PWM signal.

As stated above the first PWM signal is different than the second PWM signal. For example, the first duty cycle may be 70% while the second duty cycle may be 60%. While the first controller 206 is transmitting the first PWM signal, the second controller 208 is transmitting a close signal that closes the second switch 204. When working correctly, the first PWM signal from the first controller 206 causes the first switch 202 to open and close at the PWM frequency and first duty cycle so that the coil 210 sees a PWM signal similar to the first PWM signal. The second connection of the coil 210 also sees the PWM signal, which is sensed by the PWM sensing circuit 212.

In some embodiments, the PWM sensing circuit 212 inverts the sensed PWM signal before transmission to the first and second controllers 206, 208. The first controller 206 is transmitting the first PWM signal from an output so that first controller 206 responds by determining that the signal received from the PWM sensing circuit 212 has a duty cycle that matches the first PWM signal. For example, if the first duty cycle is 70%, the duty cycle of the signal from the PWM sensing circuit 212 will be 30% so the first controller 206 is able to recognize that a sensed duty cycle of 30% equates to an inverted, sensed PWM signal with a 70% duty cycle.

In some embodiments, the first controller 206 receives the signal from the PWM sensing circuit 212 through an analog-to-digital converter ("ADC") and digitally inverts the received signal. For example, if the received signal has a duty cycle of 30%, the first controller 206 inverts this received signal so that a resulting signal has a duty cycle of 70%, which is then compared to the first PWM signal. If the inverted signal from the PWM sensing circuit 212 has a duty cycle that matches the first duty cycle within some tolerance, the first controller 206 determines that the transmitted first PWM signal matches the received PWM signal so the first controller 206 continues to transmit the first PWM signal.

A benefit of a PWM sensing circuit 212 that inverts the sensed PWM signal is that the first and second controllers 206, 208 are able to determine if a short exists between the input where the sensed PWM signal is received and the output where the PWM signal is transmitted. For example, if the first controller 206 is transmitting the first PWM signal from an output with a duty cycle of 70%, the input of the first controller 206 where the sensed PWM signal is received from the PWM sensing circuit 212 should have a duty cycle of 30% and the signals are mirrored so when the first PWM signal is high, the sensed PWM signal is low. If the first controller 206 determines that the input is not inverted from the output, the first controller 206 is able to conclude that there is a short between the input and the output and the first controller 206 takes appropriate action, such as opening the contacts 104, sending a notification, informing the second controller 208, etc.

If the first controller 206 determines that the received signal from the PWM sensing circuit 212 has a duty cycle inconsistent with the first duty cycle, the first controller 206 takes appropriate action, such as sending a notification, opening the first switch 202, etc. Typically, when the first controller 206 determines that the received signal from the PWM sensing circuit 212 has duty cycle inconsistent with the first duty cycle, the first controller 206 notifies the second controller 208 opens the second switch 204. In other embodiments, the first and/or second controller 206, 208 sends notification of a problem, for example to a system administrator.

In addition, a fault tolerant coil control component 102 is able to compensate for a switch that has failed short. For example, if the first controller 206 determines that that the sensed PWM signal is a constant voltage while the first controller 206 is sending the first PWM signal, the first controller 206 can attempt to open the first switch 202, but the first switch 202 may be failed short. The first controller 206 may then notify the second controller 208 of the abnormal condition and the second controller 208 opens the second switch 204. Typically, the first and second controllers 206, 208 are failed short Typically, the first controller 206 sends a notification to the second controller 208 and logic within the first controller 206 and/or second controller 208 or other circuitry within the circuit breaker/safety relay 107 uses fault analysis to determine an appropriate action. For example, the first and second controllers 206, 208 may operate in tandem to determine that a single fault has occurred and that an appropriate action is to send a notification to a system administrator or to determine that a second fault has occurred which causes the first switch 202 and/or second switch 204 to open immediately.

In some embodiments, the coil control component 102 of FIG. 2 is fault tolerant, so the first controller 206 sends a notification of a problem when the received duty cycle is inconsistent with the first duty cycle without opening the first switch 202. For example, an operator receiving the notification may then take steps to reroute power so power to protected equipment 114 comes from another source, to replace the circuit breaker/safety relay 107, to shut off the circuit breaker/safety relay 107 at a convenient time, etc.

When the first controller 206 is transmitting a close command to the first switch 202, the second controller 208 transmits from an output port the second PWM signal with the second duty cycle to the second switch 204. As with the first controller 206 and first switch 202, the second switch 204 opens and closes at the frequency and duty cycle of the second PWM signal. The PWM sensing circuit 212 senses the second PWM signal at the second connection of the coil 210 and transmits an inverted signal, or in another embodiment a non-inverted signal, to the first and second controllers 206, 208. During this condition, the first controller 206 stops analyzing the received PWM signal from the PWM sensing circuit 212 and the second controller 208 starts to analyze the received signal.

In one example, the second PWM signal has a second duty cycle of 60% or some other duty cycle different than is transmitted by the first controller 206. Where the PWM sensing circuit 212 inverts the sensed PWM signal from the coil 210, the resulting PWM signal sent to the first and second controller 208 has a duty cycle of 40%. The second controller 208 may invert this received signal and then determine a duty cycle or may infer from the received PWM signal with a 40% duty cycle that the received duty cycle is consistent or inconsistent with the second duty cycle of the transmitted second PWM signal.

The statements regarding the first controller 206 above are equally applicable to the second controller 208. Typically, the first and second controllers 206, 208 are identical but transmit PWM signals with different duty cycles so that each controller 206, 28 is able to discern that a transmitted PWM signal is the same as a received PWM signal. In one embodiment, the first and second controllers 206, 208 transmit a PWM signal with a same duty cycle.

Note that the first and second controllers 206, 208 compare transmitted and received PWM signals and, in some embodiments, include a tolerance on a difference between the transmitted and received PWM signals. In some embodiments, a difference between the first duty cycle and the second duty cycle is set to allow a reasonable measurement tolerance. For example, where the difference between duty cycles is 10%, a tolerance may be +/−3% for each controller 206, 208. In other embodiments, the tolerance is in a range of +/−0.1% to 5%. One of skill in the art will recognize an appropriate tolerance based on accuracy of the PWM sensing circuit 212, component tolerances, etc.

In some embodiments, the first PWM signal and the second PWM signal operate at a fixed frequency where for each cycle, the PWM signals include an "on" portion and an "off" portion. For example, where the first PWM signal has a 60% duty cycle, the signal is high for the first 60% of the cycle and low for the last 40% of the cycle. A high signal is a signal that commands the first or second switch 202, 204 to a closed state and the low signal commands the first or second switch 202, 204 to an open state. A duty cycle is a period when the PWM signal is high. The "on" period may also be called a pulse width.

In some embodiments, the frequency of the PWM signals is a same frequency for the first and second controllers 206, 208. In other embodiments, the PWM frequency is different for the first and second controllers 206, 208. Where the PWM frequency is fixed, the PWM signals from the first and second controllers 206, 208 may or may not be synchronized. The frequency for the PWM signals is chosen for a variety of factors. For example, the PWM frequency and duty cycles for the first and second PWM signals are chosen to result in the coil 210 remaining in a condition to maintain the contacts 104 closed.

In other embodiments, the PWM frequency is chosen to be low enough for the first and second switches 202, 204 to be able to open and close during each cycle. In other embodiments, the PWM frequency is chosen to be above the audible frequency range, to minimize switching losses, etc. In some embodiments, the PWM switching frequency is 20 kilo Hertz ("kHz"). In other embodiments, the PWM switching frequency is within a range of about 5 kHz to 100 kHz. In other embodiments, the PWM switching frequency is within a range of about 1 kHz to 500 kHz. As an example, where the PWM frequency is 20 kHz, a switching cycle is 50 microseconds so where the duty cycle is 70%, the pulse width is 35 microseconds and where the duty cycle is 60%, the pulse width is 30 microseconds. The pulse width is selected to be high enough so that during each PWM cycle enough energy is transferred to the coil 210 to maintain the coil in a closed state during the "off" period of the PWM cycle. One of skill in the art will recognize factors useful in choosing the PWM frequency and tradeoffs between various possible PWM frequencies.

In addition, where the duty cycle is 70%, an average voltage to the coil 210 is about 70% of the relay power voltage 218, which represents a power savings for the circuit breaker/safety relay 107. Power savings for the circuit breaker/safety relay 107 is a benefit of the embodiments of the coil control component 102 described herein. A minimum duty cycle is chosen that will reduce power consumption of the circuit breaker/safety relay 107 while safely maintaining the contacts 104 closed while the first or second PWM signals are being transmitted from the first and second controllers 206, 208 and while maintaining an adequate safety margin between an absolute minimum average voltage across the coil 210 and a chosen minimum duty cycle.

In one embodiment, the first controller 206 and second controller 208 alternate between sending PWM signals at an alternating switch rate. The alternating switch rate is lower than the PWM frequency. In some embodiments, the alternating switch rate is much lower than the PWM frequency. For example, the alternating switch rate may be such that the first and second controllers 206, 208 alternate sending the PWM signals every second, every half second, etc. In other embodiments, the alternating switch rate is faster such as a frequency of 1 kHz.

In some embodiments, the first and second controllers 206, 208 immediately switch from the first controller 206 sending the first PWM signal while the second controller 208 sends a close signal to the second controller 208 sending the second PWM signal while the first controller 206 sends a close signal. In other embodiments, there is a delay between the first and second controllers 206, 208 sending the PWM signals. For example, both controllers 206, 208 may both transmit a close signal to the first and second switches 202, 204 during a brief transition time from one controller (e.g. 206) transmitting a PWM signal to the other controller (e.g. 208) transmitting a PWM signal. The brief transition time may be chosen to allow switching and transients to clear before commencement of transmission of another PWM signal.

Note that the coil control component 102 may include other components not shown in FIG. 2, such as another controller, reset circuitry, remote control circuitry, mechanical components of the circuit breaker 106, a thermal overload and the like. The sensor/load 220, in some embodiments, is chosen to maintain current through the coil 210 below a maximum level while maintaining enough current through the coil 210 to prevent unwanted dropout of the contacts 104. Typically, the contacts 104 are connected to a load power source 216 and a load 214. The load 214 is what is being protected by the circuit breaker/safety relay 107 and the load power 216 is typically an input power source connected to the input side of terminals of the circuit breaker/safety relay 107.

Figure 3:
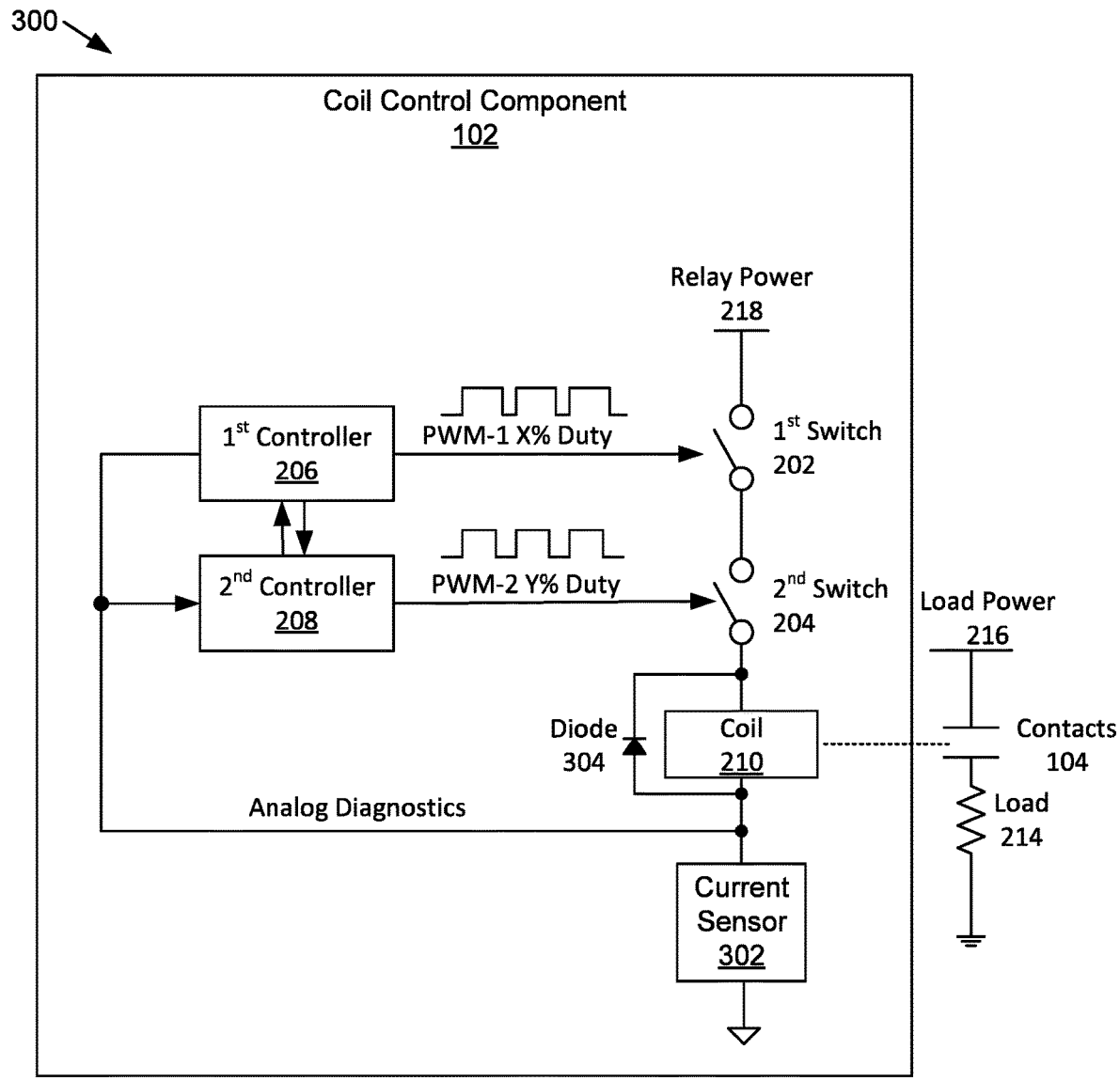
FIG. 3 is a schematic block diagram of a coil control component with a dual PWM relay driver with analog diagnostics according to an embodiment.

FIG. 3 is a schematic block diagram of an embodiment 300 with a version of a coil control component 102 with a dual PWM relay driver with analog diagnostics. The embodiment 300 includes another embodiment of a coil control component 102 that includes a first switch 202, a second switch 204, a first controller 206, a second controller 208, a coil 210, a PWM sensing circuit 212, a load 214, contacts 104, load power 216, and relay power 218, which are substantially similar to those described above in relation to the embodiment 200 of FIG. 2. The coil control component 102 also includes a current sensor 302 and a diode 304, which are described below.

The coil control component 102, in some embodiments, includes a current sensor 302 connected between the second connection of the coil 210 and a ground of the circuit breaker/safety relay 107 or safety relay. In some embodiments, the current sensor 302 is a resistor that acts as a load for the coil 210 and is chosen to have a current of the coil 210 to be within limits. In other embodiments, the current sensor 302 is separate from a load of the coil 210. In some embodiments, the current sensor 302 is a current transformer, a hall effect sensor, etc. Where the current sensor 302 is different than a resistor, the current sensor 302 may be connected differently than depicted in FIG. 3. One of skill in the art will recognize other appropriate current sensors 302.

The coil control component 102, in some embodiments, includes a diode 304 across the coil 210. The diode 304 is connected across the coil 210 as depicted and, in some embodiments, the diode 304 is a free-wheeling diode and provides protection for the coil 210, such as allowing current flow through inductance of the coil 210 while one or both of the first and second switches 202, 204 are open. In other embodiments, one or more snubbers, transient voltage surge suppression, etc. are included.

In the embodiment, 300, the first and/or second controllers 206, 208 verify proper current through the coil 210. For example, current sensing through the current sensor 302 may detect a short in the coil 210, the diode 304, the load of the coil 210, the first switch 202, the second switch 204, etc. For example, where one or more of the coil 210, the diode 304, the first switch 202, the second switch 204, etc. are shorted, the current sensor 302 may detect a higher current than expected. Where voltage at the second connection to the coil 210 is zero or very low, this may indicate a short in or across the current sensor 302 and/or a load of the coil 210. In other embodiments, the current sensor 302 may be used to detect an open condition, such as when the coil 210 fails open, when a switch 202, 204 fails open, etc.

Figure 4:
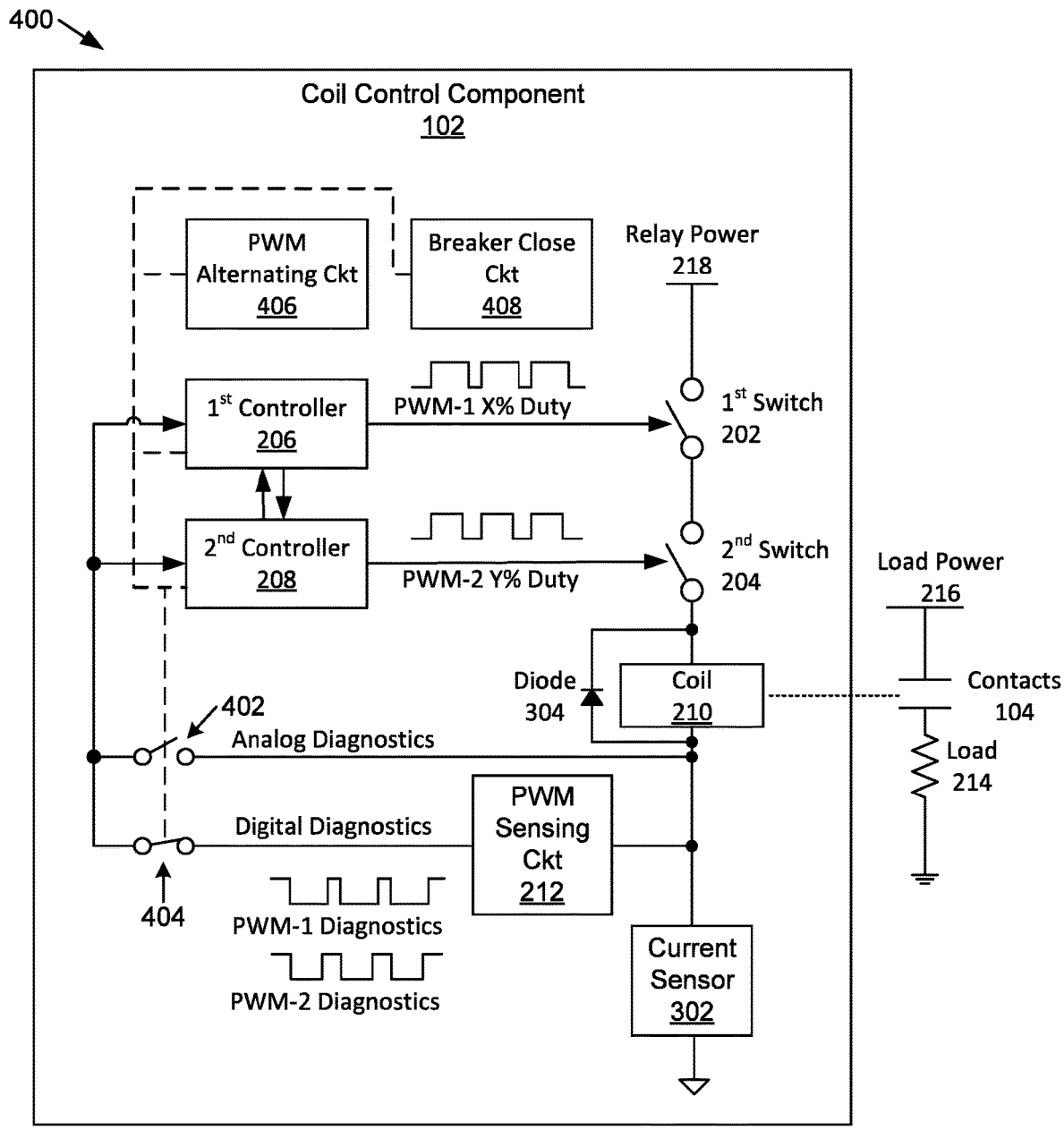
FIG. 4 is a schematic block diagram of a coil control component with a dual PWM relay driver with digital and analog diagnostics according to another embodiment.

FIG. 4 is a schematic block diagram of another embodiment 400 of another version of the coil control component 102 with a dual PWM relay driver with digital and analog diagnostics. The embodiment 400 includes another version of the coil control component 102 that includes a first switch 202, a second switch 204, a first controller 206, a second controller 208, a coil 210, a PWM sensing circuit 212, a load 214, contacts 104, load power 216, relay power 218, current sensor 302 and diode 304, which are substantially similar to those described above in relation to the embodiments 200, 300 of FIGS. 2 and 3. The coil control component 102 also includes an analog test switch 402, a PWM test switch 404, a PWM alternating circuit 406 and a breaker close circuit 408, which are described below.

The coil control component 102, in some embodiments, includes an analog test switch 402 connected between the second connection of the coil 210 and the inputs of the first controller 206 and the second controller 208 and a PWM test switch 404 connected between the PWM sensing circuit 212 and the inputs of the first controller 206 and the second controller 208. The PWM test switch 404 and the analog test switch 402 alternately close so that only one is closed at a time. For example, while the PWM sensing circuit 212 is sensing a PWM signal from the second connection of the coil 210, the PWM test switch is closed while the analog test switch 402 is opened to allow the PWM sensing circuit 212 to operate and detect PWM signals which allows the first or second controller 206, 208 to verify proper PWM operation as described above with respect to the embodiment 200 of FIG. 2.

Where the analog test switch 402 is closed, the PWM test switch 404 is open to allow the first and/or second controllers 206, 208 to verify proper current through the coil 210 as described above with regard to the embodiment 300 of FIG. 3. For example, when the analog test switch 402 is closed, current sensing through the current sensor 302 may detect a short in the coil 210, the diode 304, the load of the coil 210, the first switch 202, the second switch 204, etc. and where one or more of the coil 210, the diode 304, the first switch 202, the second switch 204, etc. are shorted, the current sensor 302 may detect a higher current than expected. Where voltage at the second connection to the coil 210 is zero or very low, this may indicate a short in or across the load of the coil 210. In other embodiments, the current sensor 302 may be used to detect an open condition, such as when the coil 210 fails open, when a switch 202, 204 fails open, etc.

The analog test switch 402 and PWM test switch 404 are depicted to be controlled by the first and second controllers 206, 208. In some embodiments, the first and second controllers 206, 208 are connected to and control the analog test switch 402 and the PWM test switch 404. In some embodiments, the first controller 206 operates the analog test switch 402 and the PWM test switch 404 while transmitting the first PWM signal and the second controller 208 operates the analog test switch 402 and the PWM test switch 404 while transmitting the second PWM signal. In other embodiments, the first and second controllers 206, 208 cooperate to operate the analog test switch 402 and the PWM test switch 404. In other embodiments, another device controls the analog test switch 402 and the PWM test switch 404.

In some embodiments, a test switching rate of switching between PWM sensing mode through the PWM test switch 404 to current sensing mode through the PWM test switch 404 is set to a rate that considers safety as well as operating constraints for the PWM sensing mode and the current sensing mode. For example, the test switching rate may allow a few PWM cycles in the PWM sensing mode before switching to the current sensing mode. In some embodiments, a length of time of the PWM sensing mode is the same as the current sensing mode. In other embodiments, a length of time of the PWM sensing mode is different than a length of time of the current sensing mode. For example, the current sensing mode to check for abnormal current in the coil 210 may be brief with respect to PWM sensing operations. In the example, the PWM sensing mode may take 90% of a test switching rate cycle while the current sensing mode may take 10% of the test switching rate cycle. A frequency of switching between the PWM sensing mode to the current sensing mode is different, in some embodiments, than alternating between controllers 206, 208 changing which sends the PWM signals.

In some embodiments, the frequency of switching between the PWM sensing mode to the current sensing mode is faster than alternating between controllers 206, 208 changing which sends that PWM signals. For example, where the PWM frequency is 20 kHz, the frequency of switching between the PWM sensing mode and the current sensing mode may be around 2 kHz while the alternating switch rate is around 1 Hz.

In some embodiments, the coil control component 102 incudes a PWM alternating circuit 406 that periodically switches between the first controller 206 sending the first PWM signal while the second controller 208 sends a close signal and the second controller 208 sending the second PWM signal while the first controller sends a close signal at an alternating switch rate. The PWM alternating circuit 406, in some embodiments, functions to alternate which of the first and second controllers 206, 208 is transmitting a PWM signal as described above as described in the embodiment 200 of FIG. 2. In other embodiments, the PWM alternating circuit 406 and/or functionality of the PWM alternating circuit 406 is incorporated in one or both of the first and second controllers 206, 208.

In some embodiments, the coil control component 102 includes a breaker close circuit 408 that commands the first controller 206 and the second controller 208 to both send a close signal to close the first switch 202 and the second switch 204 for a startup period prior to operation where one of the first and the second controllers 206, 208 sends a PWM signal and the other of the first and the second controllers 206, 208 sends a close signal. When initially closing the contacts 104, in some embodiments it is desirable to close the contacts 104 as fast as possible. Having the first switch 202 and the second switch 204 closed maximizes voltage across the coil 210, which drives the contacts 104 closed faster than where one of the first and second controllers 206, 208 is sending a PWM signal and voltage across the coil 210 is reduced.

The breaker close circuit 408 maintains both the first and second controllers 206, 208 sending the close signal for a startup period. The startup period, in some embodiments, is a time adequate for the contacts 104 to close. In some embodiments, the startup period is in the millisecond range. In other embodiments, the startup period is longer than a minimum closure time for the contacts 104. In the embodiment 400 depicted in FIG. 4, the breaker close circuit 408 is separate from the first and second controllers 206, 208. In other embodiments, the breaker close circuit 408 and/or functionality of the breaker close circuit 408 is incorporated in one or both of the first and second controllers 206, 208.

Figure 5:
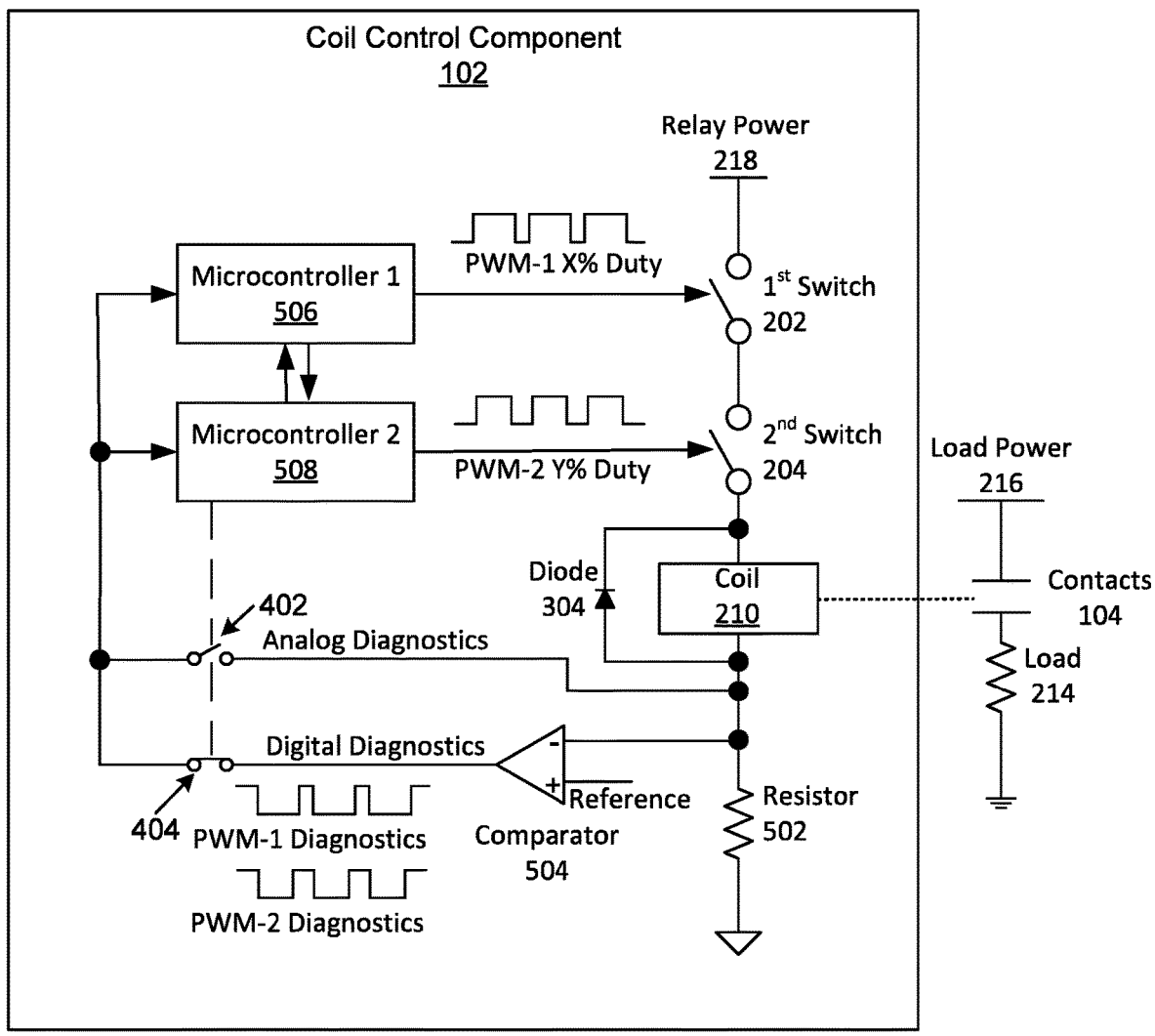
FIG. 5 is a schematic block diagram of a more detailed version of a coil control component with a dual PWM relay driver with digital and analog diagnostics according to an embodiment.

FIG. 5 is a schematic block diagram of another embodiment 500 with a more detailed version of a coil control component 102 with a dual PWM relay driver with digital and analog diagnostics. The embodiment 500 includes one embodiment of the coil control component 102 that includes a first switch 202, a second switch 204, a coil 210, a load 214, contacts 104, load power 216, relay power 218, an analog test switch 402, a PWM test switch 404, which are substantially similar to those described above in relation to the embodiments 200, 300, 400 of FIGS. 2, 3 and 4. In the embodiment 500, the coil control component 102 includes a resistor 502, a comparator 504, a first microcontroller 506 and a second microcontroller 508, which are described below.

In some embodiments, the current sensor 302 is a resistor 502 and the resistor 502 serves for both current sensing and as a load for the coil 210, as described above. The resistor 502 is sized to maintain current through the coil 210 below a maximum level and above a level to maintain the coil 210 closed when one of the first and second microcontrollers 506, 508 is transmitting a PWM signal.

In some embodiments, the coil control component 102 includes a comparator 504 that serves as a PWM sensing circuit 212. The comparator 504 includes a reference voltage connected to a positive input and the second connection to the coil 210 connected to a negative input of the comparator 504 as depicted, which serves to invert the sensed PWM signal from the second connection to the coil 210. The reference is set to a level between a voltage of the relay power source 218 and ground, and more particularly to a level between an upper level and a lower level of the sensed PWM signal so that when the sensed PWM signal is high, the output of the comparator 504 is low and when the sensed PWM signal is low, the output of the comparator 504 is high.

The first and second microcontrollers 506, 508 function substantially similar to the first and second controllers 206, 208 of the embodiments 200, 300, 400 of FIGS. 2, 3 and 4. The first and second microcontrollers 506, 508 are one possible embodiment and may include one or more processors, memory, logic for overcurrent protection, short circuit protection, diagnostics, etc. separate from the circuit breaker 106 and within the circuit breaker/safety relay 107 or within a safety relay. One of skill in the art will recognize advantages of using microcontrollers in the coil control component 102.

Figure 6:
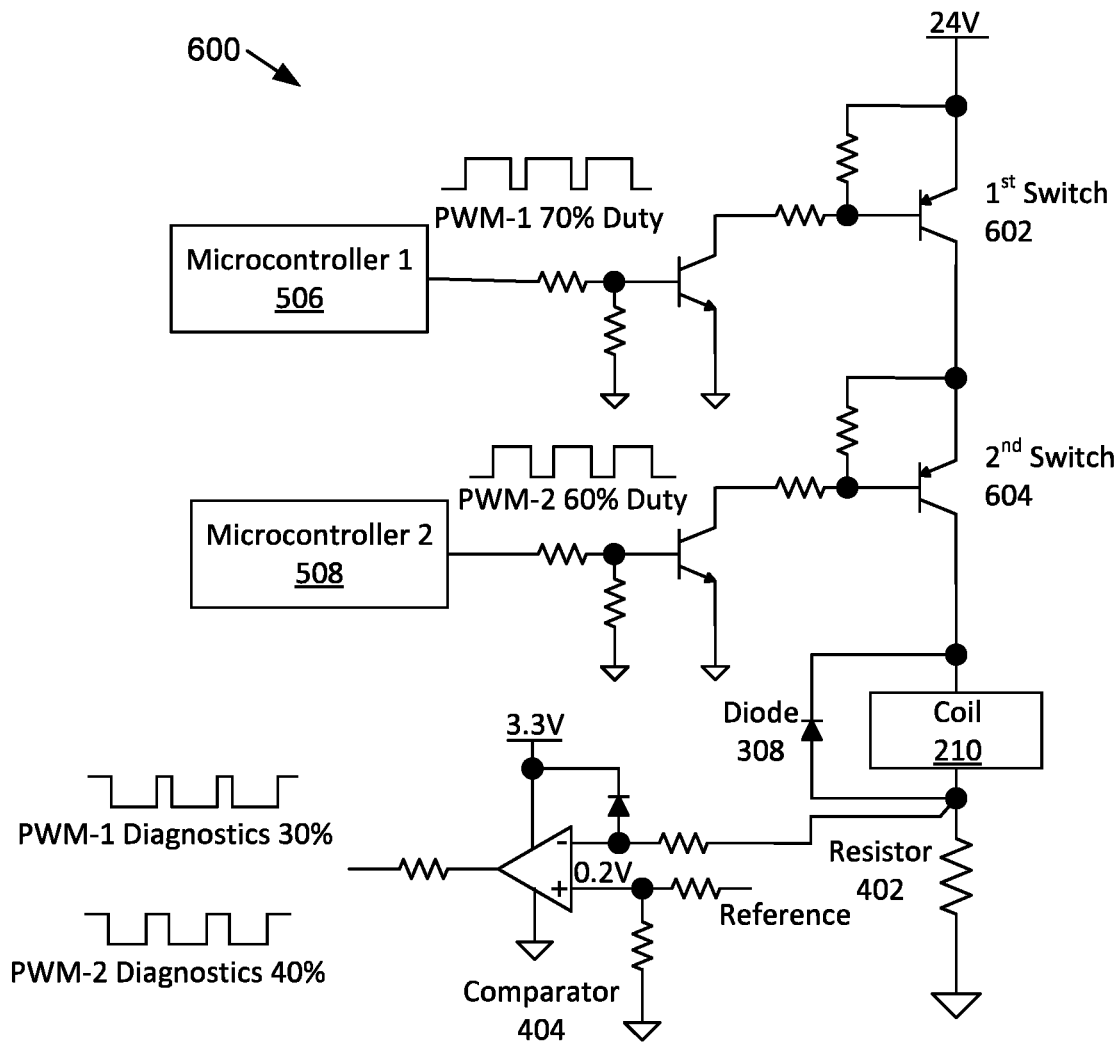
FIG. 6 is a schematic block diagram of another more detailed version of a coil control component with a dual PWM relay driver with digital diagnostics according to an embodiment.

FIG. 6 is a schematic block diagram of one embodiment 600 of a more detailed version of part of a coil control component 102 with a dual PWM relay driver with diagnostics with digital diagnostics. The embodiment 600 includes a first switch 602 and a second switch 604 as semiconductor switches along with driver circuitry. The embodiment 600 also depicts the comparator 504 with additional resistors, a supply voltage, etc. The circuitry depicted merely describe a single embodiment and one of skill in the art will recognize other embodiments for implementing the embodiments 200, 300, 400, 500 of FIGS. 2, 3, 4 and 5.

Figure 7:
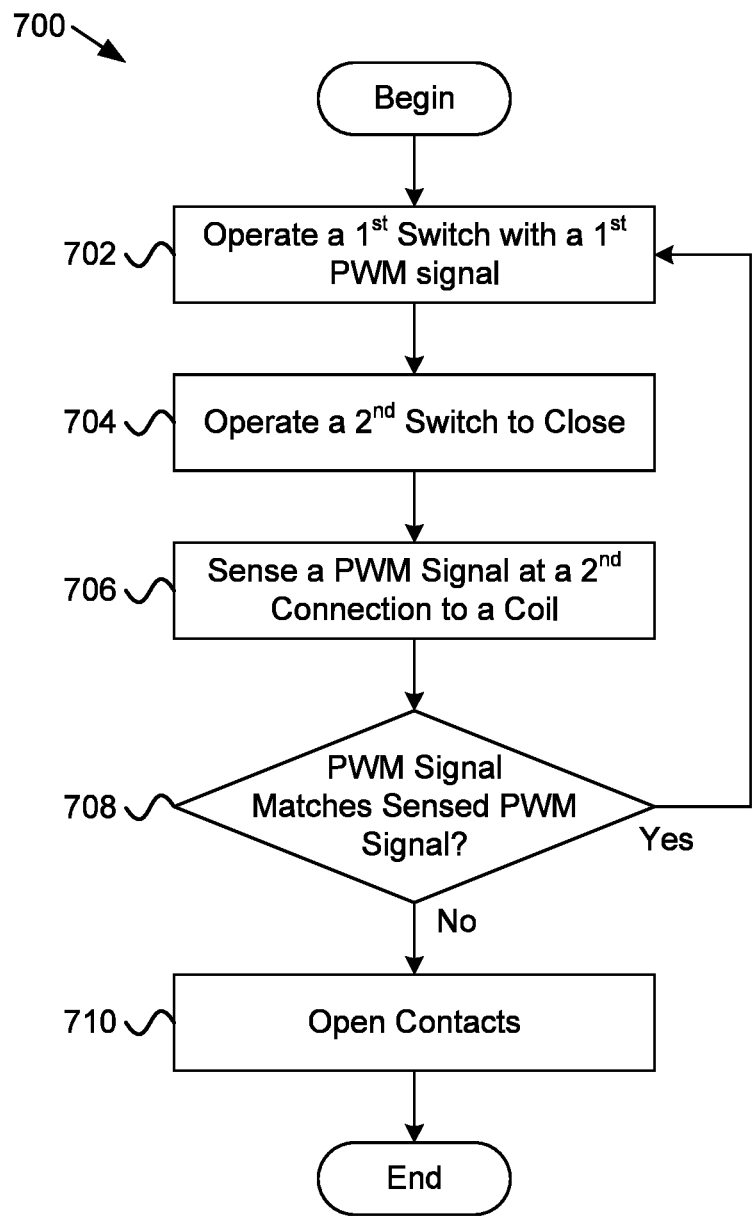
FIG. 7 is a schematic flow chart diagram depicting one embodiment of a method for operation of a dual PWM relay driver with diagnostics.

FIG. 7 is a schematic flow chart diagram depicting one embodiment of a method 700 for operation of a dual PWM relay driver with diagnostics. The method 700 operates 702 the first switch 202 with a first PWM signal which opens and closes the first switch 202 according the to the PWM signal with a first duty cycle. The method 700 simultaneously closes the second switch 204 and maintains the second switch 204 closed. The method 700 senses 706 a PWM signal at the second terminal of the coil 210 and determines 708 if the first PWM signal matches a sensed PWM signal. If the method 700 determines 708 that the first PWM signal matches the sensed PWM signal, the method 700 returns and continues to operate the first switch 202 with the first PWM signal and operates 704 the second switch 204 closed. If the method 700 determines 708 that the first PWM signal does not match the sensed PWM signal, the method 700 opens 710 the contacts 104 of the circuit breaker/safety relay 107, and the method 700 ends. After a period of time, the method 700, in some embodiments, alternates so the first switch 202 is closed and the second switch 204 operates with the second PWM signal. The method 700, in various embodiments, is implemented with the first switch 202, the second switch 204, the first controller 206, the second controller 208, the coil 210, and the PWM sensing circuit 212 or other components described herein.

Figure 8:
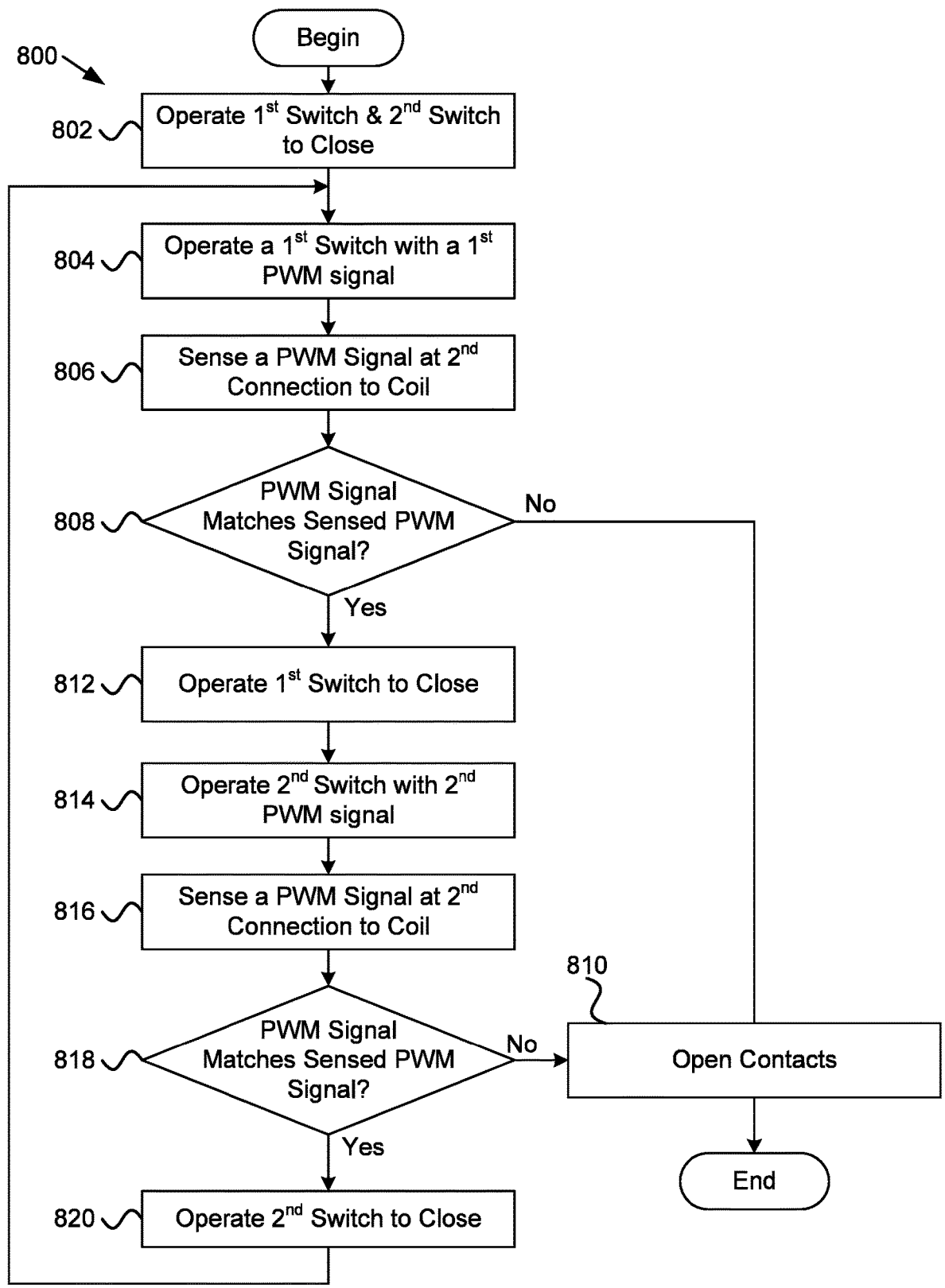
FIG. 8 is a schematic flow chart diagram depicting one embodiment of a method for operation of a dual PWM relay driver with digital or analog diagnostics and alternating PWM signals.

FIG. 8 is a schematic flow chart diagram depicting one embodiment of a method 800 for operation of a dual PWM relay driver with digital or analog diagnostics and alternating PWM signals. The method 800 begins and operates 802 the first switch 202 and the second switch 204 to close. For example, the method 800 may operate 802 both the first and second switches 202, 204 to close during an initial startup period to drive the contacts 104 closed quickly, to verify that the coil 210 will close the contacts 104, to verify that the first and the second switches 202, 204 are capable of closing, etc.

The method 800 operates 804 the first switch 202 with a first PWM signal and senses 806 a PWM signal at the second connection to the coil 210. The method 800, from the sensed PWM signal, determines 808 if the first PWM signal matches the sensed PWM signal. If the method 800 determines 808 that the first PWM signal does not match the sensed PWM signal, the method 800 opens 810 the contacts 104, and the method 800 ends. Opening 810 the contacts 104 then has an effect on the load 214, which may then open a contactor in the motor controller/contactor 110, stop a variable speed drive, or otherwise stop protected equipment 114. In other embodiments, at the time the method 800 opens 810 the contacts 104, the method 800 may also close normally closed contacts.

If the method 800 determines 808 that the first PWM signal matches the sensed PWM signal, after a period of time the method 800 operates 812 the first switch 202 to close and operates 814 the second switch 204 with the second PWM signal and senses a PWM signal at the second connection 816 to the coil 210. The method 800 determines 818 if the second PWM signal matches the sensed PWM signal. If the method 800 determines 818 that the second PWM signal does not match the sensed PWM signal, the method 800 opens 810 the contacts 104, and the method 800 ends. If the method 800 determines 818 that the second PWM signal matches the sensed PWM signal, after a period of time the method 800 operates 820 the second switch 204 to close and returns to operate the first switch 202 with the first PWM signal. In various embodiments, the method 800 is implemented with the first switch 202, the second switch 204, the first controller 206, the second controller 208, the coil 210, the PWM sensing circuit 212, the PWM alternating circuit 406, or other components described herein.

Figure 9:
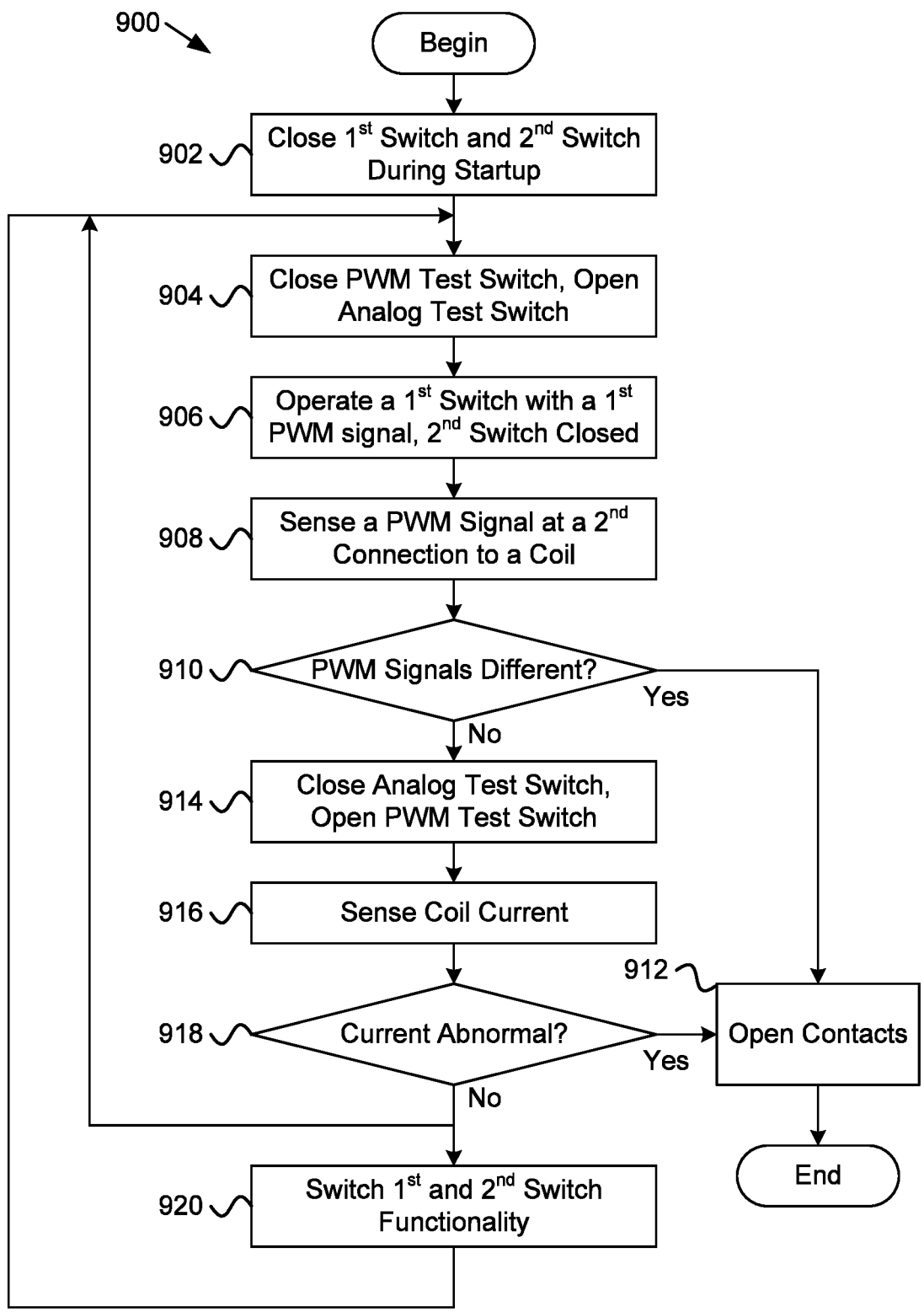
FIG. 9 is a schematic flow chart diagram depicting another embodiment of a method for operation of a dual PWM relay driver with alternating analog and digital diagnostics and alternating PWM signals.

FIG. 9 is a schematic flow chart diagram depicting another embodiment of a method 900 for operation of a dual PWM relay driver with diagnostics. The method 900 begins and closes 902 the first switch 202 and the second switch 204 during startup. For example, the method 900 closes 902 the first and second switches 202, 204 to close the contacts 104 of the circuit breaker/safety relay 107, which allows contacts of the motor controller/contactor 110 to close, which starts the motor 112. In other embodiments, the coil control component 102 and contacts 104 are in a safety relay, so that the method 900 closing 902 the first and second switches 202, 204 allows operation of protected equipment 114, which may include starting a motor 112 or allowing other equipment to operate.

The method 900 continues to close 902 both switches 202, 204 for a startup period until at least the contacts 104 are closed and the method 900 closes 904 the PWM test switch 404 and opens 904 the analog test switch 402 and operates 906 the first switch 202 with a first PWM signal and operates 906 the second switch 204 closed. The method 900 senses 908 a PWM signal at a second connection to the coil 210 and determines 910 if the first PWM signal differs from the sensed PWM signal. If the method 900 determines 910 that the first PWM signal differs from the sensed PWM signal, the method 900 opens the contacts 104 and the method 900 ends. Opening the contacts 104 affects the protected equipment 114, by stopping a motor 112, disconnecting power to equipment, etc.

If the method 900 determines 910 that the first PWM signal does not differ from the sensed PWM signal for a period of time, the method 900 closes 914 the analog test switch 402 and opens 914 the PWM test switch 404. The method 900 senses 916 current in the coil 210 and determines 918 if the current in the coil 210 is abnormal, which signals a problem with one or more of the coil 210, the first switch 202, the second switch 204, the diode 304, the current sensor 302, etc. If the method 900 determines 918 that the current in the coil 210 is abnormal, the method 900 opens 912 the contacts 104 of the circuit breaker/safety relay 107, and the method 900 ends. If the method 900 determines 918 that the current in the coil 210 is normal, after a time adequate to sense 908 abnormal current, the method 900 returns and closes 904 the PWM test switch 404 and opens 904 the analog test switch 402.

At some point during normal operation where the method 900 continues to determine 910 that the first PWM signal matches the sensed PWM signal and determines 918 that the current in the coil 210 is normal, the method switches 920 functionality of the first switch 202 and the second switch 204 so that the method 900 operates 906 the second switch 204 with the second PWM signal and operates 906 the first switch 202 closed. In this operating condition, the method 900 determines 910 if the second PWM signal matches the sensed PWM signal. In various embodiments, the method 900 is implemented with the first switch 202, the second switch 204, the first controller 206, the second controller 208, the coil 210, the PWM sensing circuit 212, the current sensor 302, the analog test switch 402, the PWM test switch 404, the diode 304, the PWM alternating circuit 406, the breaker close circuit 408, the resistor 502, the comparator 504, the first microcontroller 506, the second microcontroller 508, etc.

This description uses examples to disclose the invention and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A component comprising:
   a first switch connected to a power source of a safety relay;
   a second switch connected between the first switch and a first connection of a coil of normally open contacts of the safety relay;
   a first controller connected to control the first switch with a first output signal comprising one of a close signal that closes the first switch and a first pulse-width modulation ("PWM") signal with a first duty cycle that opens and closes the first switch on each PWM cycle;
   a second controller connected to control the second switch with a second output signal comprising one of a close signal that closes the second switch and a second PWM signal with a second duty cycle that opens and closes the second switch on each PWM cycle, the first duty cycle is different from the second duty cycle; and
   a PWM sensing circuit connected to a second connection of the coil that sends a sensed PWM signal to an input of the first controller and an input of the second controller,
   wherein the first controller sends the first PWM signal while the second controller sends a close signal and the second controller sends the second PWM signal while the first switch sends a close signal, and
   wherein the first controller verifies that the received PWM signal matches the first PWM signal while sending the first PWM signal and the second controller verifies that the received PWM signal matches the second PWM signal while sending the second PWM signal.

2. The component of claim 1, further comprising:
   a current sensor connected between the second connection of the coil and a ground of the safety relay;
   an analog test switch connected between the second connection of the coil and the inputs of the first controller and the second controller; and
   a PWM test switch connected between the PWM sensing circuit and the inputs of the first controller and the second controller,
   wherein the PWM test switch and the analog test switch alternately close, wherein the first and second controllers verify proper PWM operation while the PWM test switch is closed and verify proper current from the coil while the analog switch is closed.

3. The component of claim 2, wherein the current sensor comprises a resistor.

4. The component of claim 2, wherein the first controller opens the first switch and/or the second controller opens the second switch in response to detecting an abnormal current condition while the analog test switch is closed.

5. The component of claim 2, wherein, while the analog test switch is closed, the first and second controllers determine a current at the second connection of the coil to determine one or more of a coil failure, a first switch failure, and a second switch failure due to current not within an expected range during a particular operation of the first and second switches.

6. The component of claim 1, further comprising a PWM alternating circuit that periodically switches between the first controller sending the first PWM signal while the second controller sends a close signal and the second controller sending the second PWM signal while the first controller sends a close signal.

7. The component of claim 1, further comprising a breaker close circuit that commands the first controller and the second controller to both send a close signal to close the first switch and the second switch for a startup period prior to operation where one of the first and the second controllers sends a PWM signal and the other of the first and the second controllers sends a close signal.

8. The component of claim 1, wherein the PWM sensing circuit comprises a comparator that inverts a PWM signal received from the second connection of the coil, wherein the comparator sends the inverted PWM signal to the inputs of the first and second controllers and wherein the first and second controllers determine if the received PWM matches the first or second PWM signals based on the inverted PWM signal.

9. The component of claim 1, wherein the first PWM signal and the second PWM signal reduce power consumption of the coil and each have a frequency and duty cycle adequate to prevent unwanted coil drop out that opens the contacts.

10. The component of claim 1, wherein the first and second PWM switches comprise semiconductor switches and a switching frequency of the first PWM signal and the second PWM signal are selected to open and close the first switch during each switching cycle based on the first PWM signal and to open and close the second switch during each switching cycle based on the second PWM signal.

11. The component of claim 1, further comprising a diode connected in parallel with the coil, wherein a cathode of the diode is connected to the first connection of the coil and an anode of the diode is connected to the second connection of the coil.

12. The component of claim 1, wherein the first controller opens the first switch in response to determining that the received PWM signal does not match the first PWM signal while the first controller is sending the first PWM signal and wherein the second controller opens the second switch in response to determining that the received PWM signal does not match the second PWM signal while the second controller is sending the second PWM signal.

13. A component comprising:
a first switch connected to a power source of a safety relay, the first switch comprising a semiconductor switch;
a second switch connected between the first switch and a first connection of a coil of normally open contacts of the safety relay, the second switch comprising a semiconductor switch;
a first microcontroller connected to control the first switch, wherein a first output signal of the first microcontroller comprises one of a close signal that closes the first switch and a first pulse-width modulation ("PWM") signal with a first duty cycle that opens and closes the first switch on each PWM cycle;
a second microcontroller connected to control the second switch, wherein a second output signal of the second microcontroller comprises one of a close signal that closes the second switch and a second PWM signal with a second duty cycle that opens and closes the second switch on each PWM cycle, the first duty cycle is different from the second duty cycle; and
a comparator with an input connected to a second connection of the coil and an output connected to an input of the first microcontroller and an input of the second microcontroller, wherein the comparator inverts the received PWM signal from the second connection of the coil,
wherein the first microcontroller sends the first PWM signal while the second microcontroller sends a close signal and the second microcontroller sends the second PWM signal while the first switch sends a close signal,
wherein the first microcontroller inverts the PWM signal from the comparator and verifies that a duty cycle of a resulting PWM signal matches a duty cycle of the first PWM signal while sending the first PWM signal and the second microcontroller inverts the PWM signal from the comparator and verifies that a duty cycle of a resulting PWM signal matches a duty cycle of the second PWM signal while sending the second PWM signal, and
wherein the first microcontroller opens the first switch in response to determining that the duty cycle of the resulting PWM signal does not match the first duty cycle while the first microcontroller is sending the first PWM signal and wherein the second microcontroller opens the second switch in response to determining that the duty cycle of the resulting PWM signal does not match the second duty cycle while the second microcontroller is sending the second PWM signal.

14. The component of claim 13, further comprising:
a resistor connected between the second connection of the coil and a ground of the safety relay;
an analog test switch connected between the second connection of the coil and the inputs of the first microcontroller and the second microcontroller; and
a PWM test switch connected between the output of the comparator and the inputs of the first microcontroller and the second microcontroller,
wherein the PWM test switch and the analog test switch alternately close, wherein the first and second microcontrollers verify proper PWM operation while the PWM test switch is closed and verify proper current from the coil while the analog switch is closed, and
wherein the first microcontroller opens the first switch and/or the second microcontroller opens the second switch in response to detecting an abnormal current condition while the analog test switch is closed.

15. The component of claim 14, wherein, while the analog test switch is closed, the first and second microcontrollers determine a current at the second connection of the coil to determine one or more of a coil failure, a diode failure, a resistor failure, a first switch failure, and a second switch failure due to current not within an expected range during a particular operation of the first and second switches.

16. The component of claim 13, further comprising a PWM alternating circuit that periodically switches between the first microcontroller sending the first PWM signal while the second microcontroller sends a close signal and the second microcontroller sending the second PWM signal while the first microcontroller sends a close signal.

17. The component of claim 13, further comprising a breaker close circuit that commands the first microcontroller and the second microcontroller to both send a close signal to close the first switch and the second switch for a startup period prior to operation where one of the first and the second microcontrollers sends a PWM signal and the other of the first and the second microcontrollers sends a close signal.

18. The component of claim 13, wherein the first PWM signal and the second PWM signal reduce power consumption of the coil and each have a frequency and duty cycle adequate to prevent unwanted coil drop out to open the contacts.

19. A system comprising:
an electrical component; and
a safety relay controlling power to the electrical component, wherein the safety relay comprises:
a first switch connected to a power source of a safety relay;

a second switch connected between the first switch and a first connection of a coil of normally open contacts of the safety relay;

a first controller connected to control the first switch with a first output signal comprising one of a close signal that closes the first switch and a first pulse-width modulation ("PWM") signal with a first duty cycle that opens and closes the first switch on each PWM cycle;

a second controller connected to control the second switch with a second output signal comprising one of a close signal that closes the second switch and a second PWM signal with a second duty cycle that opens and closes the second switch on each PWM cycle, the first duty cycle is different from the second duty cycle; and a PWM sensing circuit connected to a second connection of the coil that sends a sensed PWM signal to an input of the first controller and an input of the second controller, wherein the first controller sends the first PWM signal while the second controller sends a close signal and the second controller sends the second PWM signal while the first switch sends a close signal, and wherein the first controller verifies that the received PWM signal matches the first PWM signal while sending the first PWM signal and the second controller verifies that the received PWM signal matches the second PWM signal while sending the second PWM signal.

20. The system of claim 19, further comprising:

a current sensor connected between the second connection of the coil and a ground of the safety relay;

an analog test switch connected between the second connection of the coil and the inputs of the first controller and the second controller; and a PWM test switch connected between the PWM sensing circuit and the inputs of the first controller and the second controller, wherein the PWM test switch and the analog test switch alternately close, wherein the first and second controllers verify proper PWM operation while the PWM test switch is closed and verify proper current from the coil while the analog switch is closed.

* * * * *